(12) United States Patent
Perry et al.

(10) Patent No.: US 9,166,170 B1
(45) Date of Patent: Oct. 20, 2015

(54) APPARATUS FOR PRODUCING CARBON-COATED NANOPARTICLES AND CARBON NANOSPHERES

(75) Inventors: W. Lee Perry, Jemez Springs, NM (US); John C. Weigle, Santa Fe, NM (US); Jonathan Phillips, Rio Rancho, NM (US)

(73) Assignee: U.S. Department of Energy, Washington, DC (US)

( * ) Notice: Subject to any disclaimer, the term of this patent is extended or adjusted under 35 U.S.C. 154(b) by 1350 days.

(21) Appl. No.: 12/326,252

(22) Filed: Dec. 2, 2008

Related U.S. Application Data

(62) Division of application No. 11/464,600, filed on Aug. 15, 2006, now Pat. No. 8,609,060.

(51) Int. Cl.
*B01J 19/08* (2006.01)
*H01L 51/00* (2006.01)

(52) U.S. Cl.
CPC .................. *H01L 51/0045* (2013.01)

(58) Field of Classification Search
CPC ................................. H05H 2245/124
USPC ............... 422/186, 186.03; 427/446; 977/844
See application file for complete search history.

(56) References Cited

U.S. PATENT DOCUMENTS

2002/0022672 A1* 2/2002 Thunhorst et al. ........... 521/50.5
2004/0009118 A1* 1/2004 Phillips et al. ............. 423/592.1

* cited by examiner

*Primary Examiner* — Natalia Levkovich
(74) *Attorney, Agent, or Firm* — Thomas S. O'Dwyer; James C. Durkis; John T. Lucas

(57) ABSTRACT

An apparatus for producing carbon-coated nano- or micron-scale particles comprising a container for entraining particles in an aerosol gas, providing an inlet for carbon-containing gas, providing an inlet for plasma gas, a proximate torch for mixing the aerosol gas, the carbon-containing gas, and the plasma gas, bombarding the mixed gases with microwaves, and providing a collection device for gathering the resulting carbon-coated nano- or micron-scale particles. Also disclosed is a method and apparatus for making hollow carbon nano- or micro-scale spheres.

21 Claims, 3 Drawing Sheets

APPARATUS FOR PRODUCING CARBON-COATED NANOPARTICLES AND CARBON NANOSPHERES

CROSS-REFERENCE TO RELATED APPLICATIONS

The present application is a divisional of application Ser. No. 11/464,600 filed on Aug. 15, 2006, the entire contents of which are hereby incorporated by reference. The aforementioned parent application was issued as U.S. Pat. No. 8,609,060 on Dec. 17, 2013.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. W-7405-ENG-36 awarded by the U.S. Department of Energy and Los Alamos National Laboratory.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to carbon-coated nanoparticles and carbon nanospheres and methods of manufacture of same.

2. Description of Related Art

Metallic nanoparticles exhibit a unique set of properties, considerably different than the bulk structures due to their large surface areas. They have a variety of applications, including energetic materials, optical and magnetic materials, electronic devices, and solid state chemical sensors. Existing methods of producing these particles include electric arc discharge, metal gas evaporation, metal evaporation in a flowing gas stream, mechanical attrition, sputtering, electron beam evaporation, electron beam induced atomization of binary metal azides, expansion of metal vapor in a supersonic free jet, inverse micelle techniques, laser ablation, laser-induced breakdown of organometallic compounds, pyrolysis of organometallic compounds, and microwave plasma decomposition of organometallic compounds.

A factor that limits use of metallic nanoparticles is their air-sensitivity. Metals form a passivation layer upon exposure to oxygen and, in some cases, become pyrophoric. The passivation layers that form on nanoparticles are often comparable in size to the size of the particle itself. For example, Applicants have determined that aluminum nanoparticles ranging in diameter from approximately 2 to 50 nm form a passivation layer approximately 4 nm thick. On a 25 nm particle, the passivation layer thus represents nearly 70% of the volume of the particle.

It is therefore desirable to produce nanoparticles that maintain their metallic properties while also minimizing or eliminating the passivation layer. One method to achieve this goal is by coating the particle with a thin layer of carbon, preferably in the form of graphite. Nanoparticles formed via electric arc discharge between metal-filled graphite electrodes have been encapsulated in a graphite 10-80 nm thick. These particles were resistant to oxidation. R. Seshadri, et al., Chem. Phys. Lett. 231:308-313 (1994); see also P. Nolan, et al., "Graphite encapsulation of catalytic metal nanoparticles", Carbon 34:817 (1996).

The present invention is of an improved manufacturing method wherein one can form carbon-coated nanoparticles in an atmospheric pressure microwave plasma torch, a much less costly, more robust, and more productive solution. The invention is also of hollow carbon nanospheres which are formed by first making carbon-coated metal nanoparticles and then removing the metal.

BRIEF SUMMARY OF THE INVENTION

The present invention is of a method of making carbon-coated nano- or micron-scale particles, comprising: entraining particles in an aerosol gas; providing a carbon-containing gas; providing a plasma gas; mixing the aerosol gas, the carbon-containing gas, and the plasma gas proximate a torch operated at approximately ambient pressure; bombarding the mixed gases with microwaves; and collecting resulting carbon-coated nano- or micron-scale particles. In the preferred embodiment, the carbon-containing gas comprises a hydrocarbon gas, the hydrocarbon gas comprises one or more of methane, ethane, and ethylene, and the torch comprises a quartz torch. The mixing step preferably occurs within the torch, more preferably wherein the aerosol gas is introduced within the torch via a conduit, and most preferably wherein the conduit comprises an alumina tube. The resulting particles can comprise nanoparticles. The particles can comprise metal particles, preferably of one or more of copper, manganese, aluminum, iron, cobalt, nickel, lead, titanium, tin, chromium, tungsten, potassium, lithium, magnesium, cesium, sodium, tantalum, and alloys thereof. The particles can also comprise silicon, for example wherein the resulting particles comprise quantum dots. The invention is also of the resulting carbon-coated nano- or micron-scale particles manufactured according to this method of the invention.

The invention is also of a method of making nano- or micron-scale carbon spheres, comprising: entraining metal particles in an aerosol gas; providing a carbon-containing gas; providing a plasma gas; mixing the aerosol gas, the carbon-containing gas, and the plasma gas proximate a torch; bombarding the mixed gases with microwaves; collecting resulting carbon-coated nano- or micron-scale particles; and removing the metal from the particles to create resulting nano- or micron-scale carbon spheres. In the preferred embodiment, removing comprises placing the particles in an acid bath. The invention is further of nano- or micron-scale carbon spheres manufactured according to this method.

The invention is additionally of an apparatus for making carbon-coated nano- or micron-scale particles, comprising: a container for entraining particles in an aerosol gas; an inlet for a carbon-containing gas; an inlet for a plasma gas; a torch proximate which the gases mix at approximately ambient pressure; a microwave generator for bombarding the mixed gases; and a collection device for the resulting carbon-coated nano- or micron-scale particles. In the preferred embodiment, the torch comprises a quartz torch, preferably wherein the gases mix within the torch, more preferably wherein the aerosol gas is introduced within the torch via a conduit, and most preferably wherein the conduit comprises an alumina tube. The invention preferably additionally comprises a waveguide between the microwave generator and the torch.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

The present invention is of an improved manufacturing method wherein one can form carbon-coated (preferably metal, e.g., aluminum) nanoparticles in an microwave plasma torch operated from atmospheric pressure to pressures as low as 0.1 atmospheres, a much less costly, more robust, and more productive solution. The invention is also of hollow carbon nanospheres which are formed by first making carbon-coated metal nanoparticles and then removing the metal. For purposes of the specification and claims, a nanoparticle is a particle having a diameter of less than approximately 100 nm.

Figure 1:
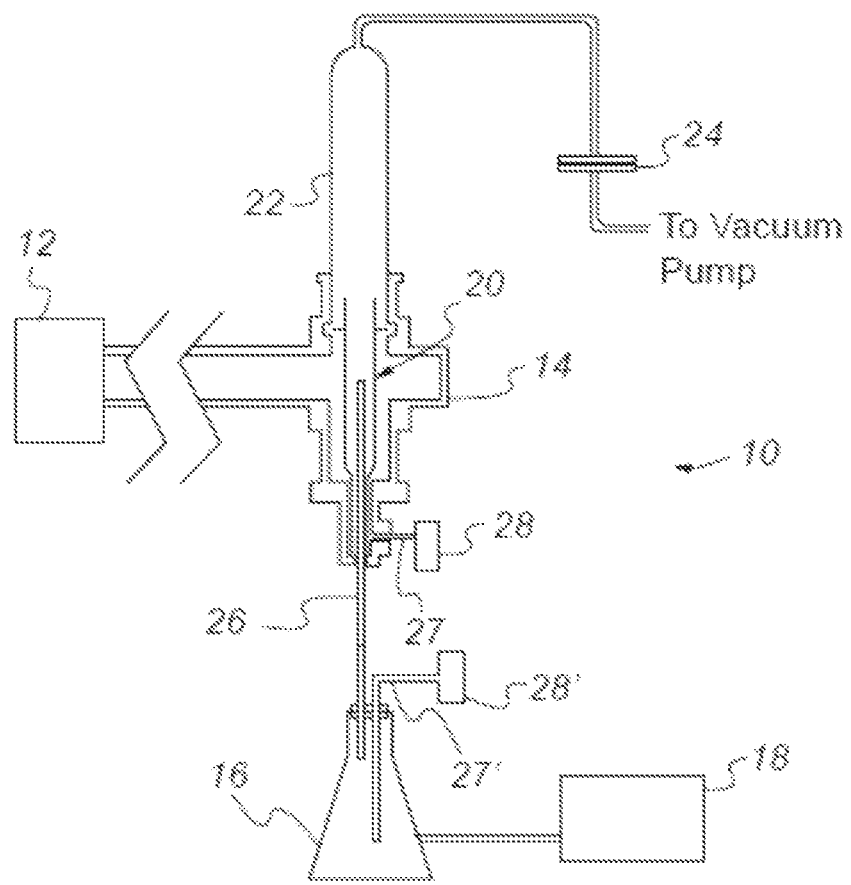
FIG. 1 is a schematic diagram of the preferred apparatus of the invention.

FIG. 1 shows a schematic of the preferred apparatus 10 of the invention, which employs a low power microwave plasma torch (e.g., one from MKS/Astex). It comprises a microwave generator 12 (2.45 GHz) and waveguide 14, gas-handling equipment 16, a particle feeder 18, a quartz torch 20, a Pyrex® chimney 22, and filters 24 for carbon-coated nanoparticle collection. A conduit 26, preferably a 6 mm ID (3 mm OD) alumina tube, extends into the center of the torch and acts as a conduit for a particle aerosol. Two gas flows 27, 27', each preferably controlled by calibrated rotameters 28,28', enter the torch. The first, the plasma gas, preferably flows through the annulus between the alumina tube and the quartz torch. The second, the aerosol gas, preferably flows into a particle reservoir and entrains the particles of interest. The particle reservoir (not shown) is preferably either mounted on a vibrator, which is driven at less than 100 Hz to assist in particle dispersal within the aerosol, or placed in an ultrasonic bath. The aerosol then flows upward through the alumina tube and into the plasma chamber, entering very near the hottest region of the plasma.

To generate carbon-coated aluminum nanoparticles, for example, the precursor particles can be irregularly shaped, micron sized (40-100 μm) aluminum (99.5%) from Silverline Corp. The gases, containing entrained particles, flow upward through the chimney and into a filter, where the particles are collected. The torch preferably operates at atmospheric pressure, although it is also possible to operate at sub-atmospheric pressures. For sub-atmospheric operation the pressure is preferably maintained by a vacuum pump and butterfly valve, which may be controlled by an MKS PID controller.

The carbon source is introduced into the torch with the aerosol gas. Any carbon-containing gas may be used, although hydrocarbons such as methane, ethane, and ethylene are the preferred gases. Ethylene is presently preferred for this process. The aluminum likely atomizes in the hot zone of such a plasma, and the hydrocarbon disproportionates. Downstream from the plasma hot zone, the aluminum and carbon atoms form liquid mixtures. Upon cooling even further downstream, the carbon segregates from the metal core to form a carbon overlayer. The volume fraction of ethylene fed preferably ranges from 0.0125% to 0.75%. It is desirable to minimize the fraction of hydrocarbon, since excess carbon forms soot as it passes through the system.

Figure 2:
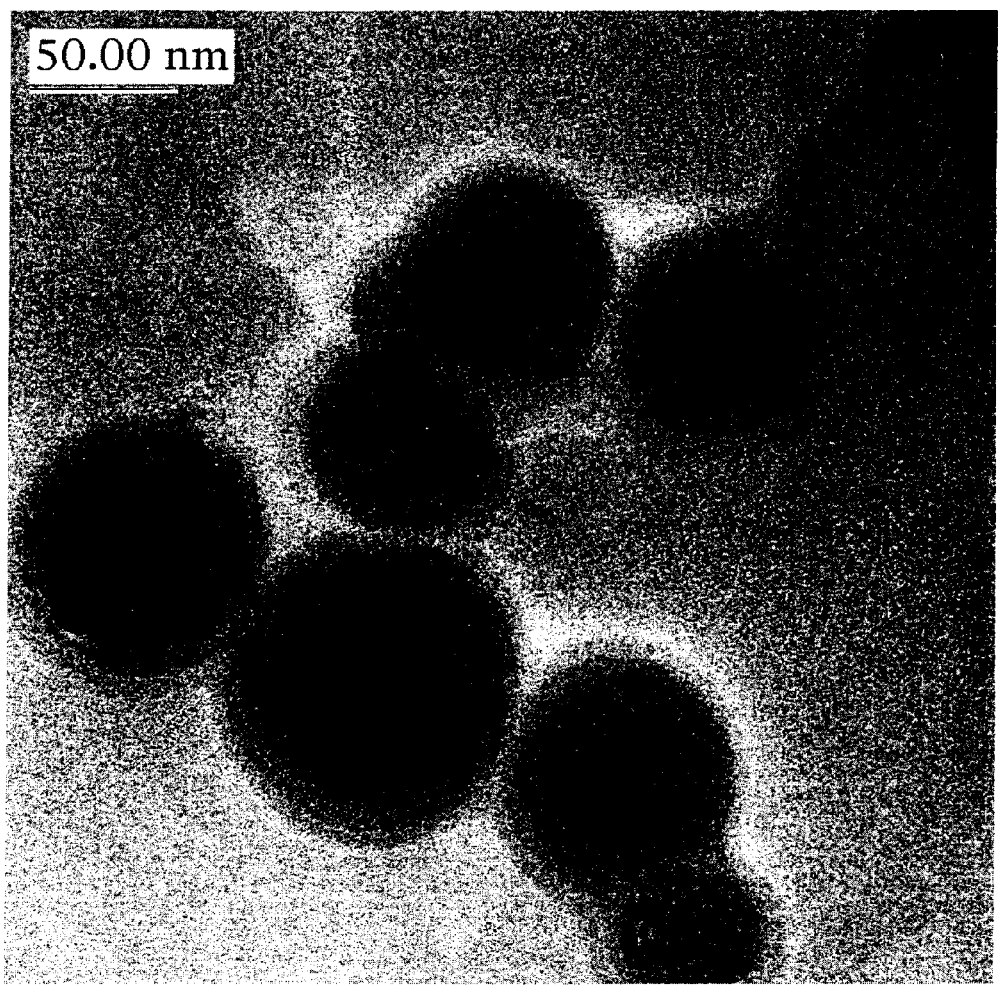
FIG. 2 is a Transmission Electron Micrograph ("TEM") image of an encapsulated Al nanoparticles made according to the invention.
Figure 3:
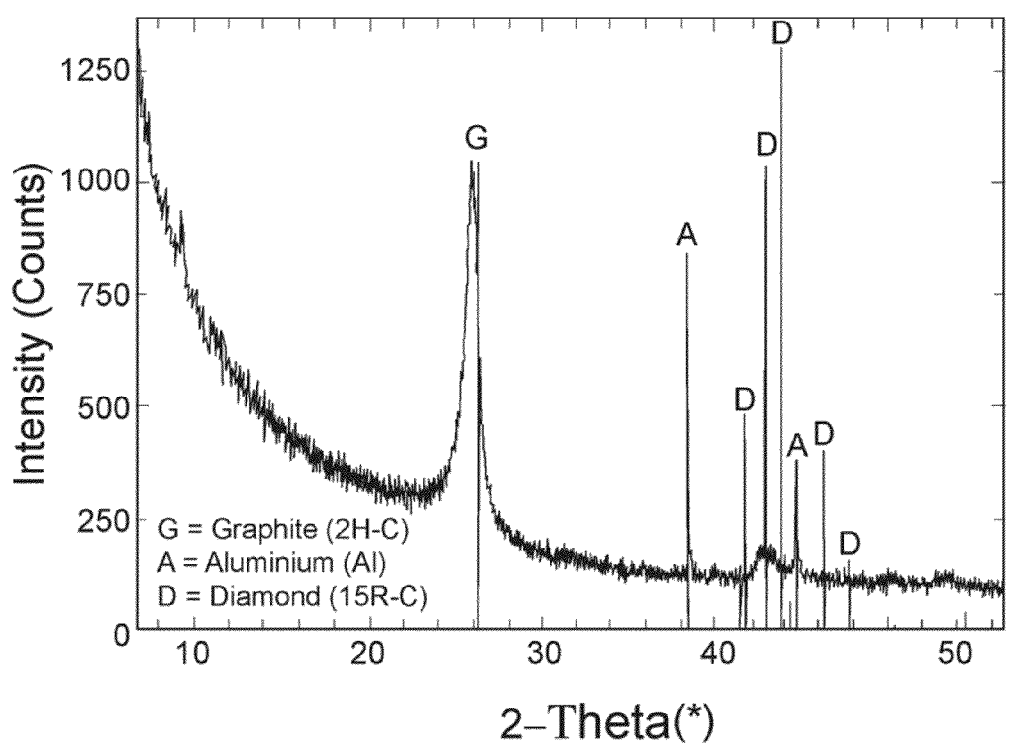
FIG. 3 is an x-ray diffraction pattern of the encapsulated Al nanoparticles of FIG. 2.

The particles collected on the filters (e.g., filter paper) were in the case of carbon-coated aluminum nanoparticles analyzed primarily using transmission electron microscopy (TEM) and X-ray diffraction (XRD). FIG. 2 shows a TEM image of a sample produced in an argon plasma at 500 W, feeding 0.25% ethylene. The image clearly contains nanoparticles (20-70 nm) in a shell and core configuration. The identities of the shell and core are unclear from the image. XRD of a comparable sample is shown in FIG. 3. It indicates that the sample is primarily graphite and aluminum metal. Significantly, neither $Al_2O_3$ nor $Al_4C_3$ is observed in the XRD spectrum.

Many uses of carbon-coated metal nanoparticles exist once they are available in quantity, as permitted by the present invention. Fuel applications, such as solid propellants, can utilize them. Other uses include use for explosives and primers in small arms ammunition. Metals that may be usefully coated include those metals that oxidize in ambient conditions, such as aluminum, iron, cobalt, nickel, and alloys thereof, as well as other metals such as copper, manganese, lead, titanium, tin, chromium, tungsten, potassium, lithium, magnesium, cesium, sodium, tantalum, and alloys thereof. Non-metals can also be usefully coated, such as silicon. Indeed, the invention can be used to make so-called quantum dots.

The invention is also of hollow carbon nanoparticles (referred to herein as nanospheres) formed first as carbon-coated metal nanoparticles, followed by removal of the metal. The preferred method of metal extraction is treatment at ambient temperature in an acid bath for a short time period (e.g., about one hour). As understood by one of skill in the art, the acid choice and strength will be dependent upon the metal chosen.

Such carbon nanospheres are also quite useful. Graphite fibers have been shown to have about five times the thermal conductivity of copper but have some give when compressed, and so compacted graphitic nanospheres are usefully compacted into heatsinks in semiconductor applications, or simply as fillers for polymers used in applications for which high thermal conductivity is desirable, such as circuit boards and integrated circuit packages. Graphite spheres may also be useful as lubricant additives, particularly in extreme environments encountered such as those encountered in space.

The present invention is also of micron scale (less than approximately 100 micron diameter) carbon spheres, which can be manufactured by the same process as with nanospheres and provide much the same benefits.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An apparatus for making hollow carbon-coated nano- and micron-scale particles, said apparatus comprising:
a plasma chamber having a quartz torch set in a housing that is joined by
a waveguide assembly capable of forming a hot region within said chamber;
a particle reservoir that is connected to a particle feeder;
nano- or micron-scale metal particles that are fed into said reservoir by said particle feeder;
an inlet connected to said particle reservoir for introducing an aerosol gas as well as a carbon containing gas into said reservoir;
a conduit for transporting the subject particles that are entrained in said aerosol gas along with said carbon containing gas from said reservoir to said hot region;
an inlet proximately located at the base of said torch for introducing a plasma gas into said chamber by flowing through an annulus between said conduit and said torch into said hot region;
a microwave generator with input to said waveguide assembly for bombarding said gases that mix within said hot region, whereupon activation the subject particles atomize and the carbon-containing gas disproportionates;
an elongated glass column chimney axially aligned above the chamber hot region for receiving the heated mixed gases wherein the ascending particles and carbon atoms liquefy and segregate to form a particle core and carbon overlayer;
a filter station that is distally connected by pipette to the enclosed top of said chimney;
means for collecting the resulting carbon-coated nano- or micron-scale particles that are deposited at said filter station; and
an acid bath wherein said collected particles are subsequently placed for extraction of their metal cores resulting in hollow carbon nano- or micron-scale spheres.

2. The apparatus of claim 1 additionally comprising a vibrator upon which said particle reservoir is mounted in order to assist in dispersing said particles within the entraining aerosol gas.

3. The apparatus of claim 1 wherein said nano- or micron-scale articles comprise metal particles.

4. The apparatus of claim 1 wherein said metal particles comprise one or more oxidizing metal selected from the group consisting of aluminum, iron, cobalt, nickel and alloys thereof.

5. The apparatus of claim 1 wherein said conduit comprises a 6 mm ID (3 mm OD) alumina tube.

6. The apparatus of claim 2 wherein said vibrator comprises a platform for mounting said particle reservoir that is driven at less than 100 Hz.

7. The apparatus of claim 1 wherein said carbon-containing gas comprises a hydrocarbon gas.

8. The apparatus of claim 7 wherein said hydrocarbon gas comprises one or more gases selected from the group consisting of methane, ethane, and ethylene.

9. The apparatus of claim 8 wherein the selected hydrocarbon gas to be fed into said reservoir is ethylene.

10. The apparatus of claim 1 wherein said metal particles comprise one or more non-oxidizing metal selected from the group consisting of copper, manganese, lead, titanium, tin, chromium, tungsten, potassium, lithium, magnesium, cesium, sodium, tantalum, and alloys thereof.

11. The apparatus of claim 1 wherein said acid bath into which said collected particles are placed is for a predetermined period of time dependent upon the strength of the acid chosen as well as the particle core metal.

12. The apparatus of claim 1 additionally comprising an ultrasonic bath wherein said particle reservoir is placed in order to assist in dispersing said particles within the entraining aerosol gas.

13. The apparatus of claim 1 wherein said elongated glass column chimney comprises a heat resistant borosilicate glass.

14. An apparatus for making carbon-coated nano- and micron-scale particles, said apparatus comprising:
a plasma chamber having a quartz torch set in a housing that is joined by
a waveguide assembly capable of forming a hot region within said chamber when activated;
a particle reservoir that is mounted upon a vibrator and connected to a particle feeder;
nano- or micron-scale particles that are fed into said reservoir by said particle feeder;
an inlet connected to said particle reservoir for introducing an aerosol gas as well as a carbon containing gas into said reservoir;
a conduit for transporting the subject particles that are entrained in said aerosol gas along with said carbon containing gas from said reservoir to said hot region;
an inlet proximately located at the base of said torch for introducing a plasma gas into said chamber by flowing through an annulus between said conduit and said torch into said hot region;
a microwave generator with input to said waveguide assembly for bombarding said gases that mix within said hot region, whereupon activation the subject particles atomize and the carbon-containing gas disproportionates;
an elongated glass column chimney axially aligned above the chamber hot region for receiving the heated mixed gases wherein the ascending particles and carbon atoms liquefy and segregate to form a particle core and carbon overlayer;
a filter station that is distally connected by pipette to the enclosed top of said chimney;
a vacuum pump and butterfly valve, located downstream from said filter station, for operation in sub-atmospheric conditions; and
means for collecting the resulting carbon-coated nano- or micron-scale particles that are deposited at said filter station.

15. The apparatus of claim 14 wherein said vacuum pump and butterfly valve is controlled by a proportional-integral-derivative (PID) controller.

16. The apparatus claim of claim 14 wherein said hydrocarbon gas to be fed into said reservoir is ethylene.

17. The apparatus of claim 16 wherein the volume fraction of the ethylene gas to be fed ranges from 0.0125% to 0.75%.

18. The apparatus of claim 14 additionally comprising an acid bath wherein said collected particles are subsequently placed for extraction of their metal cores resulting in hollow carbon nano- and micron-scale spheres.

19. An apparatus for making carbon-coated nano- and micron-scale particles, said apparatus comprising:
a plasma chamber having a quartz torch set in a housing that is joined by
a waveguide assembly capable of forming a hot region within said plasma chamber;

a particle reservoir that is connected to a particle feeder;
nano- or micron-scale non-metal particles that are fed into said reservoir by said particle feeder;
an inlet connected to said particle reservoir for introducing an aerosol gas as well as a carbon containing gas into said reservoir;
a conduit for transporting the subject particles that are entrained in said aerosol gas along with said carbon containing gas from said reservoir to said hot region;
an inlet proximately located at the base of said torch for introducing a plasma gas into said chamber by flowing through an annulus between said conduit and said torch into said hot region;
a microwave generator with input to said waveguide assembly for bombarding said gases that mix within said hot region, whereupon activation the subject particles atomize and the carbon-containing gas disproportionates;

an elongated glass column chimney axially aligned above the chamber hot region for receiving the heated mixed gases wherein the ascending particles and carbon atoms liquefy and segregate to form a particle core and carbon overlayer;

a filter station that is distally connected by pipette to the enclosed top of said chimney; and means for collecting the resulting carbon-coated nano- or micron-scale particles that are deposited at said filter station.

20. The apparatus of claim 19 wherein said non-metal particles comprise silicon.

21. The apparatus of claim 20 wherein said resulting particles comprise quantum dots.

* * * * *